United States Patent
Deng (10) Patent No.: US 11,646,494 B2
(45) Date of Patent: May 9, 2023

(54) INDEPENDENT TUNING SYSTEM FOR ANTENNA, TUNING METHOD, AND COMMUNICATION DEVICE

(71) Applicant: Gree Electric Appliances, Inc. of Zhuhai, Guangdong (CN)

(72) Inventor: Yanbo Deng, Guangdong (CN)

(73) Assignee: Gree Electric Appliances, Inc. of Zhuhai, Guangdong (CN)

( * ) Notice: Subject to any disclaimer, the term of this patent is extended or adjusted under 35 U.S.C. 154(b) by 103 days.

(21) Appl. No.: 17/053,579

(22) PCT Filed: Dec. 25, 2018

(86) PCT No.: PCT/CN2018/123276
§ 371 (c)(1),
(2) Date: Nov. 6, 2020

(87) PCT Pub. No.: WO2020/037915
PCT Pub. Date: Feb. 27, 2020

(65) Prior Publication Data
US 2021/0234557 A1    Jul. 29, 2021

(30) Foreign Application Priority Data
Aug. 23, 2018   (CN) .......................... 201810969627.6

(51) Int. Cl.
*H04B 1/00* (2006.01)
*H01Q 7/00* (2006.01)
(Continued)

(52) U.S. Cl.
CPC ............. *H01Q 7/005* (2013.01); *G01R 29/10* (2013.01); *H01Q 1/241* (2013.01);
(Continued)

(58) Field of Classification Search
CPC .......... H04B 1/18; H04B 1/005; H04B 7/063; H04B 1/0485; H04B 17/12; H01Q 1/241; H01Q 13/03; G01R 29/10
See application file for complete search history.

(56) References Cited

U.S. PATENT DOCUMENTS

| 2010/0073103 A1 | 3/2010 | Spears et al. |
| 2017/0013629 A1 | 1/2017 | Hong et al. |

(Continued)

FOREIGN PATENT DOCUMENTS

| CN | 101902239 | 12/2010 |
| CN | 201781539 A | 12/2010 |

(Continued)

OTHER PUBLICATIONS

International Search Report issued in connection with PCT Application No. PCT/CN2018/123276 dated Apr. 30, 2019.

(Continued)

*Primary Examiner* — Thanh C Le
(74) *Attorney, Agent, or Firm* — Victoria Friedman; Dennemeyer & Associates LLC (57) ABSTRACT

An independent tuning system for an antenna, a tuning method, and a communication device are disclosed. The independent tuning system for the antenna is applicable to a communication device. The communication device includes an antenna tuner, a tuning driver and a tuning program. The tuning program includes: a storage component, an input component, a matching component, and a tuning component. A tuning parameter corresponding to optimized antenna efficiency is matched according to a tuning parameter input by a user and a graph or curve chart of correspondence information between tuning parameters and antenna efficiency stored in the tuning component. An NV value of the tuning driver is tuned according to the tuning (Continued)

parameter to achieve independent optimized tuning of the antenna.

12 Claims, 7 Drawing Sheets

(51) Int. Cl.
    *H04B 1/04*     (2006.01)
    *G01R 29/10*     (2006.01)
    *H01Q 1/24*     (2006.01)
    *H01Q 13/10*     (2006.01)
    *H04B 1/18*     (2006.01)
    *H04B 7/06*     (2006.01)
    *H04B 17/12*     (2015.01)

(52) U.S. Cl.
    CPC ........... *H01Q 13/103* (2013.01); *H04B 1/005* (2013.01); *H04B 1/0458* (2013.01); *H04B 1/18* (2013.01); *H04B 7/063* (2013.01); *H04B 17/12* (2015.01)

(56) References Cited

U.S. PATENT DOCUMENTS

2017/0346178 A1* 11/2017 Shi ...................... H04B 17/102
2023/0056713 A1* 2/2023 Belkin ................ H04B 1/1036

FOREIGN PATENT DOCUMENTS

| CN | 104571148 | | 4/2015 |
| CN | 104571148 | A | 4/2015 |
| CN | 107566054 | A | 1/2018 |
| CN | 107592405 | | 1/2018 |
| CN | 107592405 | A | 1/2018 |
| CN | 108259061 | A | 7/2018 |

OTHER PUBLICATIONS

Chinese office action for application No. 109696276 dated May 9, 2020.

* cited by examiner

INDEPENDENT TUNING SYSTEM FOR ANTENNA, TUNING METHOD, AND COMMUNICATION DEVICE

CROSS REFERENCE TO RELATED APPLICATIONS

This is a 35 U.S.C. 371 National Stage Patent Application of International Application No. PCT/CN2018/123276, filed Dec. 25, 2018, which claims priority to Chinese application 201810969627.6, filed Aug. 23, 2018, each of which is hereby incorporated by reference in its entirety.

TECHNICAL FIELD

The present disclosure relates to the technical field of communications, and in particular to an independent tuning system for an antenna, a tuning method, and a communication device.

BACKGROUND

In the era of rapid development of information, users of communication devices are increasing year by year. Especially, people take communication electronic devices such as mobile phones and tablets at every moment. The current smart phone antenna design is compatible with China Mobile, China Unicom, China Telecom and some foreign bands. The bandwidth is very wide from 800 MHz to 2.7 GHz. Therefore, antennas of smart phones, especially today's full-screen mobile phones, cannot achieve good efficiency in all bands. The factory antenna of the mobile phone should take into account the various bands and sacrifice the efficiency of some bands to achieve acceptable average antenna efficiency on all bands. After a user purchases a mobile phone, the antenna efficiency of each band is fixed and cannot be changed. However, the demand bands of users are different. When a user wants to use China Mobile band and a high-frequency 4G network, a mobile phone of this user does not take low-frequency efficiency into account. However, the demand of this user cannot be realized since there is no space and access point for users to operate. This problem isolates the inevitability of the connection between user demands and mobile phone design. User participation experience is severely isolated. In the present age that user experience is paramount, the real expectations of users are obviously not met.

A communication method known to the inventors includes the following steps. At step A, testing and calibration are performed to obtain the same antenna normal radiation index and at least two sets of radio frequency parameters corresponding to other radiation indexes, and the at least two sets of radio frequency parameters are stored. At step B, a set of radio frequency parameters corresponding to a certain radiation index is called to switch as needed. At step C, after the switch is successful, the radio frequency parameters corresponding to a certain radiation index are configured in each transmitting component for communication. Although the disclosure changes the situation that when the mobile phone antenna has HAC index requirements, the mobile phone stores multiple sets of radio frequency parameters instead of redesigning a specific antenna, and the changes in the required radio frequency parameters are evaluated according to different user demands or external present disclosure environments, so that mobile phone software switches to the most suitable radio frequency parameters for loading. However, the disclosure is mainly to meet the HAC requirements of the operators by storing the set parameters and then loading according to user needs, there are less parameter data set and stored, which cannot be adjusted independently, and the user's sense of participation is not strong.

SUMMARY

In some embodiments of the present disclosure, an independent tuning system for an antenna is applicable to a communication device. The communication device includes an antenna tuner, a tuning driver and a tuning program. The tuning program includes: a storage component, configured to store a graph or a curve chart of correspondence information between tuning parameters and antenna efficiency in the tuning program; an input component, configured to receive a tuning parameter input by a user; a matching component, configured to match a tuning parameter corresponding to optimized antenna efficiency according to the tuning parameter input by the user and the graph or curve chart of the correspondence information between the tuning parameters and the antenna efficiency stored in the tuning program; and a tuning component, configured to tune a tuning parameter of the antenna tuner according to the matched tuning parameter and write an NV value of the tuning driver to achieve independent optimized tuning of the antenna.

In some embodiments, a communication device is further provided, which includes the independent tuning system for the antenna. The communication device is one of the followings: a mobile phone, a tablet computer, and a walkie-talkie.

In some embodiments, a tuning method of an independent tuning system for an antenna is further provided, which includes the following steps.

A graph or a curve chart of correspondence information between tuning parameters and antenna efficiency is stored in a tuning program.

A tuning parameter input by a user is received.

A tuning parameter corresponding to optimized antenna efficiency is matched according to the tuning parameter input by the user and the graph or curve chart of the correspondence information between the tuning parameters and the antenna efficiency stored in the tuning program.

A tuning parameter of the antenna tuner is tuned according to the matched tuning parameter and an NV value of the tuning driver is written to achieve independent optimized tuning of the antenna.

DETAILED DESCRIPTION

The present disclosure will be further described below through specific implementations.

Figure 1:
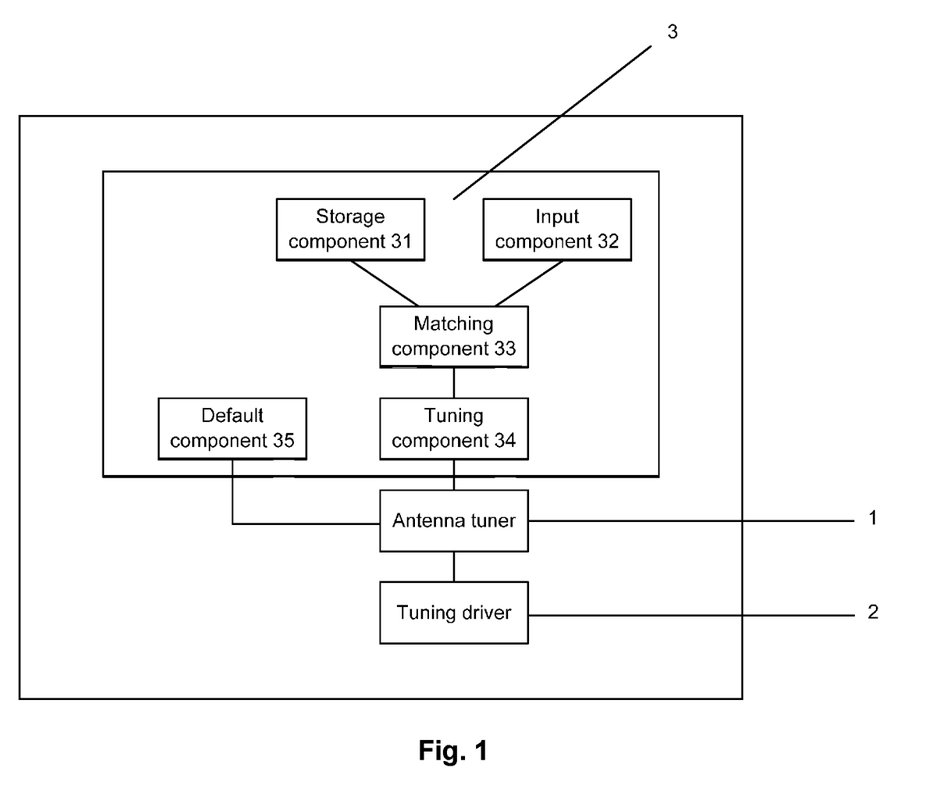
FIG. 1 is a block diagram of an independent tuning system for an antenna according to a first embodiment of the present disclosure.

As shown in FIG. 1, an independent tuning system for an antenna is applied to a communication device. The communication device is one of the followings: a mobile phone, a tablet computer, and a walkie-talkie. In the present embodiment, a mobile phone is used as an example for description. The antenna efficiency is a to ratio of power radiated by an antenna to active power input to the antenna. The communication device is provided with a tuner capable of tuning parameters. An NV value is used for recording relevant information of the communication device. The change of the tuning parameter is written into the NV value of a driver, an original NV value is changed, and the driver drives the communication device to perform tuned parameters.

An antenna tuner 1, a tuning driver 2 and a tuning program 3 are arranged in the communication device. The tuning program 3 is an independent antenna tuning APP. The independent antenna tuning APP includes:

a storage component 31, configured to store a graph or a curve chart of correspondence information between tuning parameters and antenna efficiency into the tuning program 3;

an input component 32, configured to receive a tuning parameter input by a user;

a matching component 33, configured to match a tuning parameter corresponding to optimized antenna efficiency according to the tuning parameter input by the user and the graph or curve chart of the correspondence information between the tuning parameters and the antenna efficiency stored in the tuning program;

a tuning component 34, configured to tune a tuning parameter of the antenna tuner according to the matched tuning parameter and write an NV value of the tuning driver 2 to achieve independent optimized tuning of the antenna; and a default parameter component 35, configured to default a factory-set antenna parameter of the communication device.

The band used by each country and operator is fixed, so the country and region where the user is located depends on the band used by the mobile phone. When the performance of the low, intermediate and high frequency bands is good, the default band is automatically used, the signal strength of a capacitance value size of the tuning parameter of the antenna tuner 1 in a certain band is different. That is, different bands correspond to a certain capacitance value, so as to obtain the best signal strength. The band used by the mobile phone at this moment is switched to make the mobile phone obtain the best use state.

Figure 2:
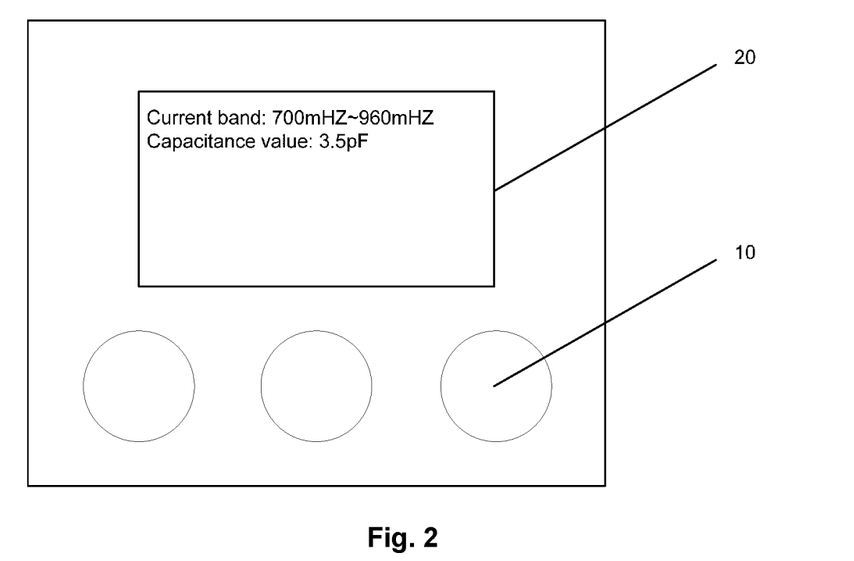
FIG. 2 is a diagram of an independent tuning APP software interface for an antenna according to an exemplary embodiment of the present disclosure.

As shown in FIG. 2, an independent antenna tuning APP interface has a setting area 10. The setting area 10 is provided with a tuning parameter setting key, tuning a parameter confirmation key, and a default parameter setting key. The interface is also provided with a display area 20. The display area 20 displays the tuning parameter input by the user, and further displays the set tuning parameters and a graph or curve chart of antenna efficiency relationship information corresponding to the set tuning parameters in real time.

Embodiment One

Figure 3:
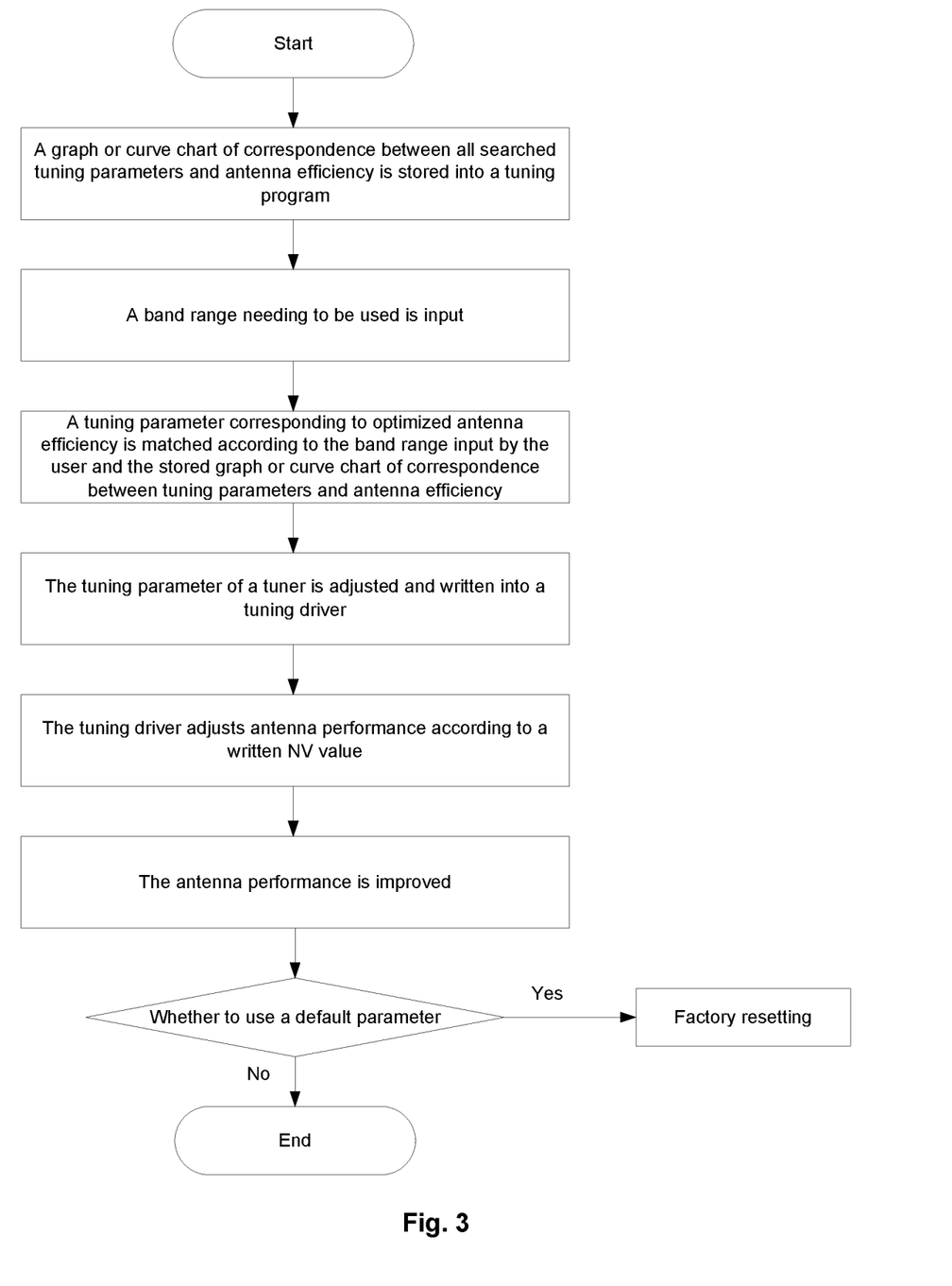
FIG. 3 is a flowchart of a tuning method according to a first embodiment of the present disclosure.

As shown in FIG. 3, a tuning method of an independent tuning system for an antenna includes the following steps.

At step S1, a graph or curve chart of correspondence between all searched tuning parameters and antenna efficiency is stored in the tuning program at the development stage of mobile phones.

At step S2, a user directly inputs a band range to be used in an independent antenna tuning APP interface according to the use needs, such as 880 MHz to 958 MHz.

At step S3, a tuning parameter corresponding to optimized antenna efficiency is matched according to the band range input by the user and the stored graph or curve chart of correspondence between tuning parameters and antenna efficiency, the best antenna efficiency is selected, and a tuning parameter confirmation key is pressed down.

At step S4, a tuning parameter of the antenna tuner is tuned according to the matched tuning parameter and an NV value of the tuning driver is written to achieve independent optimized tuning of an antenna.

At step S5, when the user does not need to tune and presses a default parameter setting key, the communication device will restore to factory-set antenna parameters.

Embodiment Two

Figure 4:
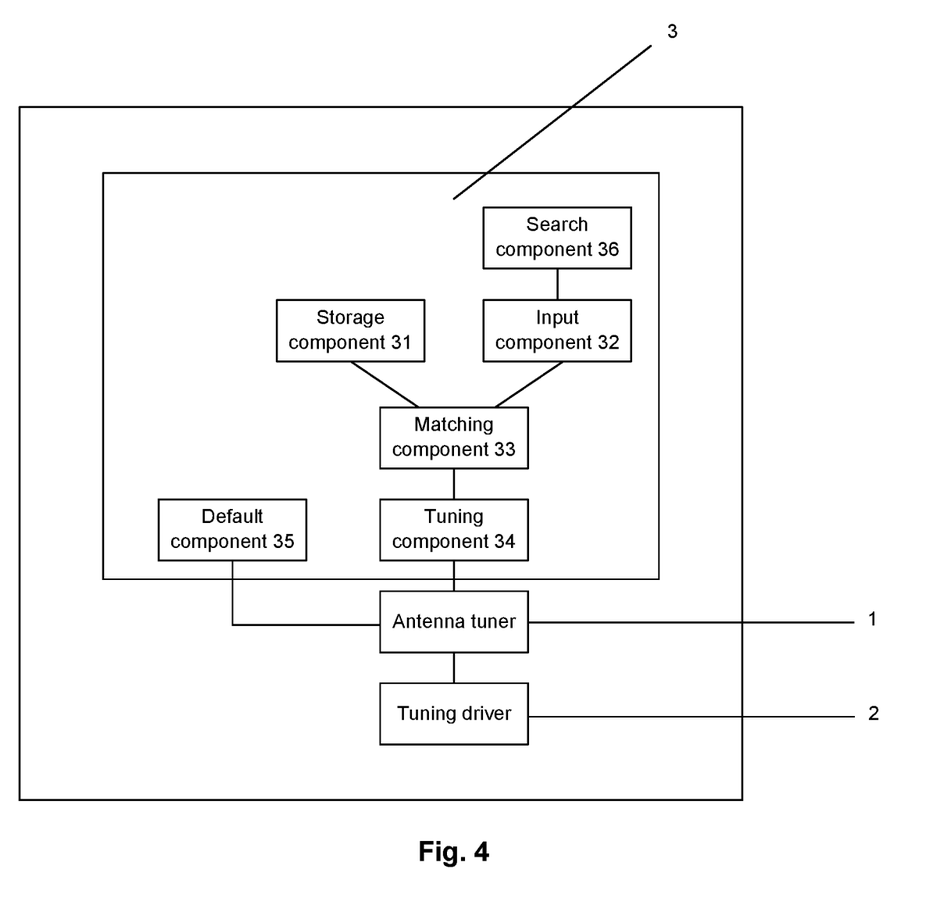
FIG. 4 is a block diagram of an independent tuning system for an antenna according to a second embodiment of the present disclosure.

As shown in FIG. 4, the difference between the present embodiment and Embodiment One is that the independent antenna tuning APP further includes a search component 36, configured to search a band range according to other information input by the user.

Figure 5:
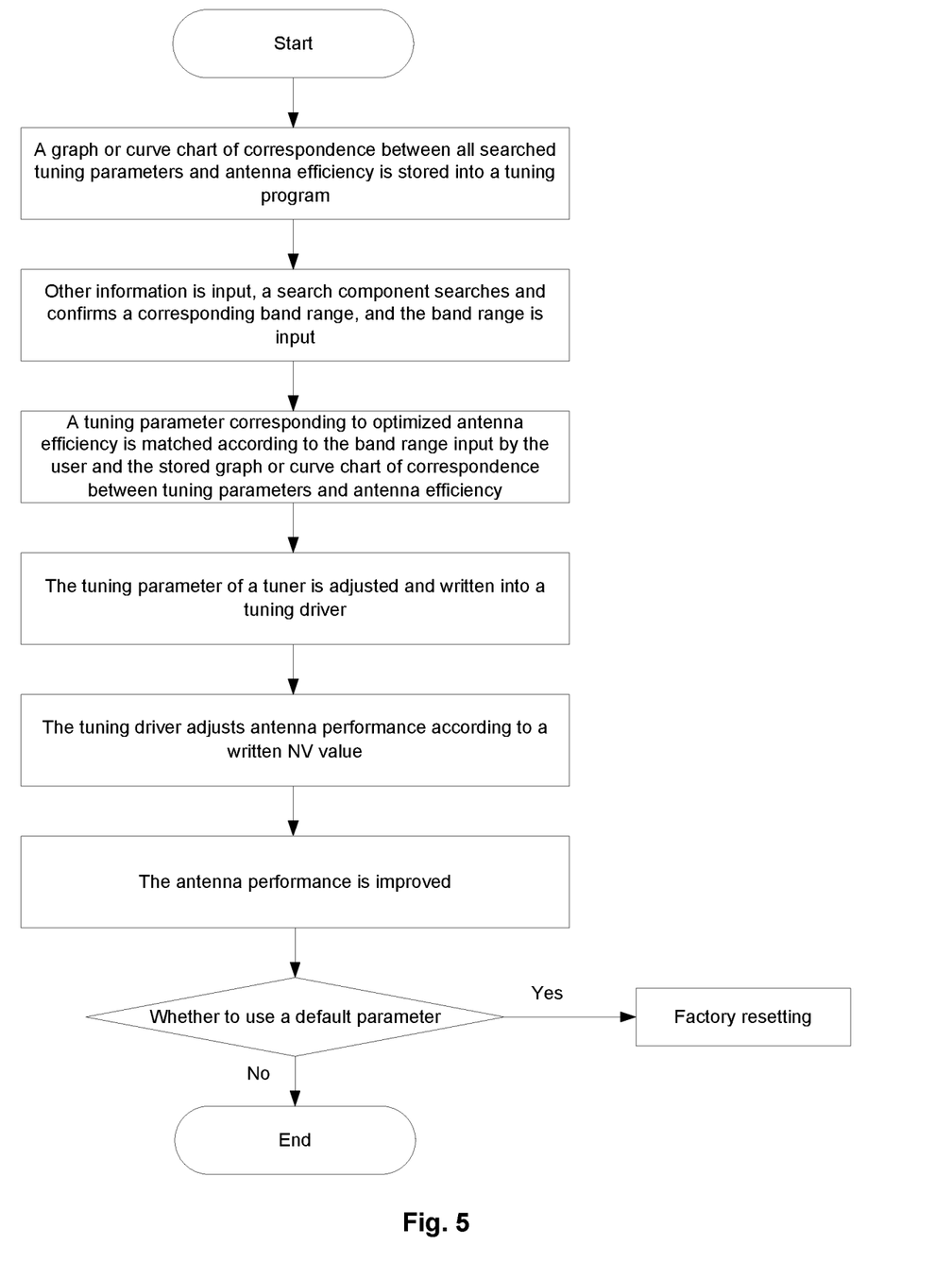
FIG. 5 is a flowchart of a tuning method according to a second embodiment of the present disclosure.

As shown in FIG. 5, a tuning method of an independent tuning system for an antenna includes the following steps.

At step S1, a graph or curve chart of correspondence between all searched tuning parameters and antenna efficiency is stored in the tuning program at the development stage of mobile phones.

At step S2, a user inputs other information in the independent tuning APP interface according to the use needs, such as mobile, 2G, or low frequency, the search component searches and confirms a corresponding band range, and the user inputs the band range according to the band range confirmed by the search component into the independent antenna tuning APP interface.

At step S3, a tuning parameter corresponding to optimized antenna efficiency is matched according to the band range input by the user and the graph or curve chart of correspondence between the tuning parameters and the antenna efficiency, and a tuning parameter confirmation key is pressed down.

At step S4, a tuning parameter of the antenna tuner is tuned according to the matched tuning parameter and an NV value of the tuning driver is written to achieve independent optimized tuning of an antenna.

At step S5, when the user does not need to tune and presses a default parameter setting key, the communication device will restore to factory-set antenna parameters.

Embodiment Three

Figure 6:
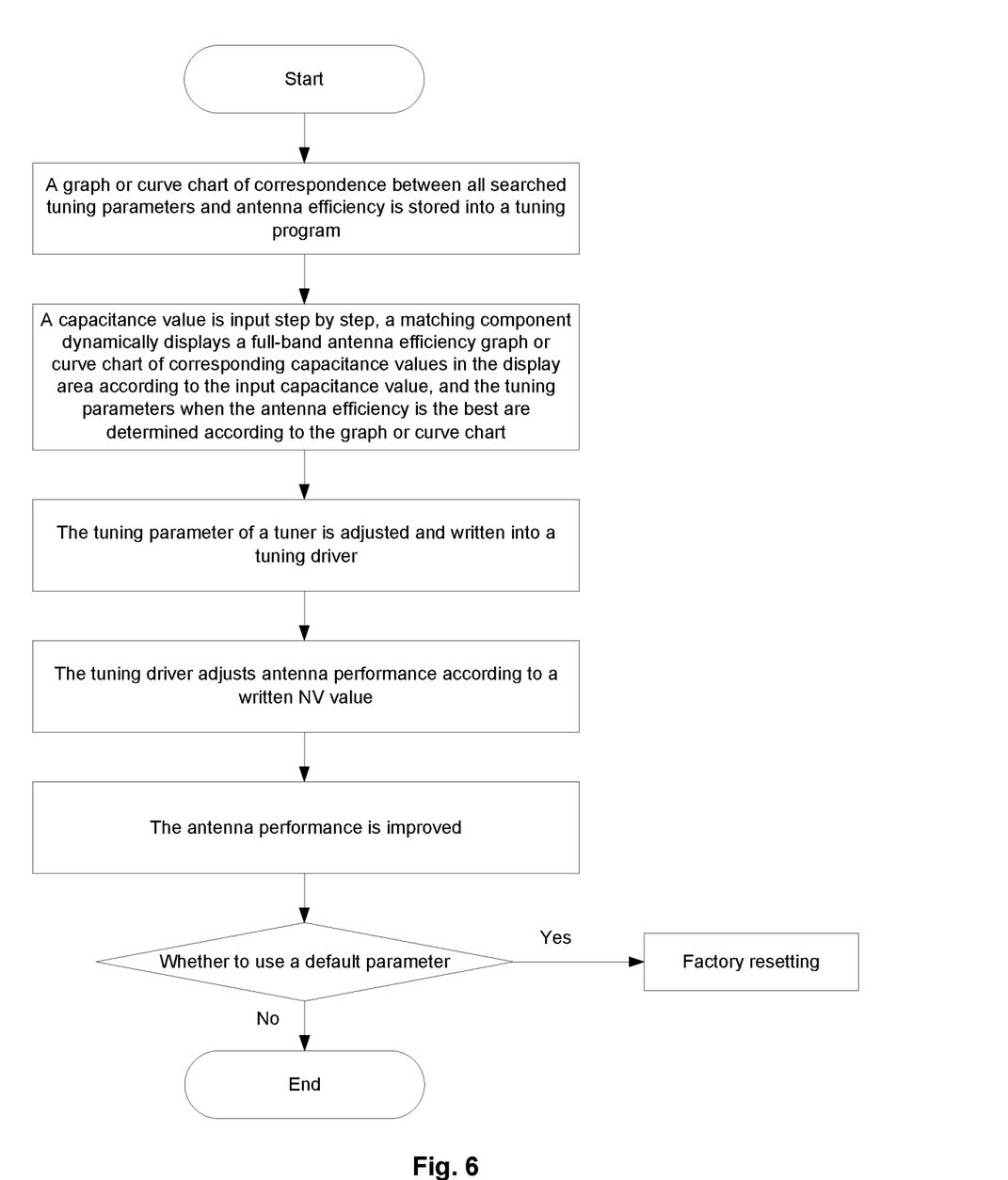
FIG. 6 is a flowchart of a tuning method according to a third embodiment of the present disclosure.

As shown in FIG. 6, the difference between the present embodiment and Embodiment One or Embodiment Two is that: the present embodiment adopts step-by-step adjustment of tuning parameters as follows.

At step S1, a graph or curve chart of correspondence between all searched tuning parameters and antenna efficiency is stored in the tuning program at the development stage of mobile phones.

At step S2, a user inputs a capacitance value step by step, the matching component dynamically displays a full-band antenna efficiency graph or curve chart of corresponding capacitance values in the display area according to the input capacitance value, and the user determines the tuning parameters when the antenna efficiency is the best according to the graph or curve chart, and presses the tuning parameter confirmation key.

At step S3, a tuning parameter of the antenna tuner is tuned according to the matched tuning parameter and an NV value of the tuning driver is written to achieve independent optimized tuning of an antenna.

At step S4, when the user does not need to tune and presses a default parameter setting key, the communication device will restore to factory-set antenna parameters.

Figure 7:
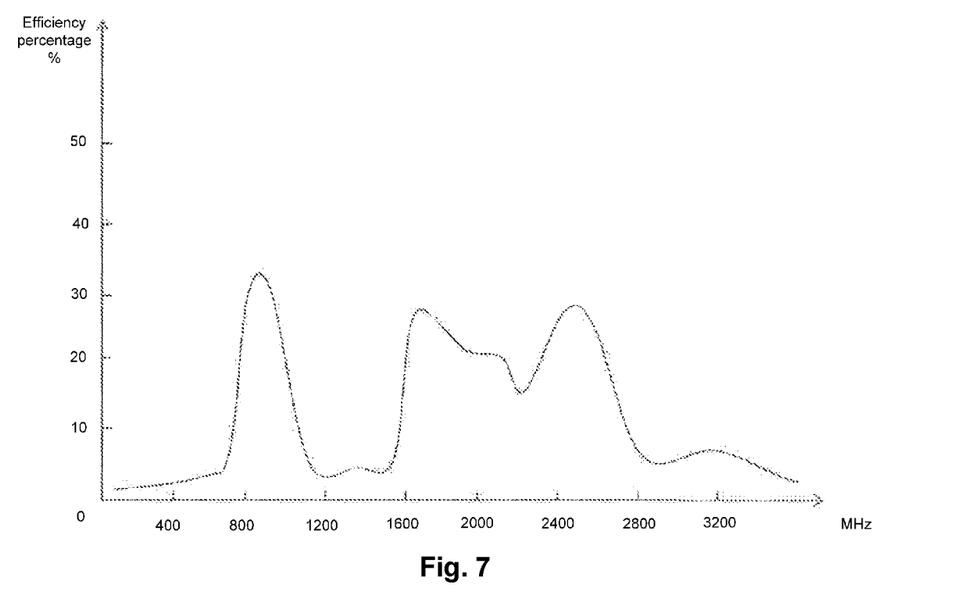
FIG. 7 is a diagram of default parameter antenna efficiency according to an exemplary embodiment of the present disclosure.
Figure 8:
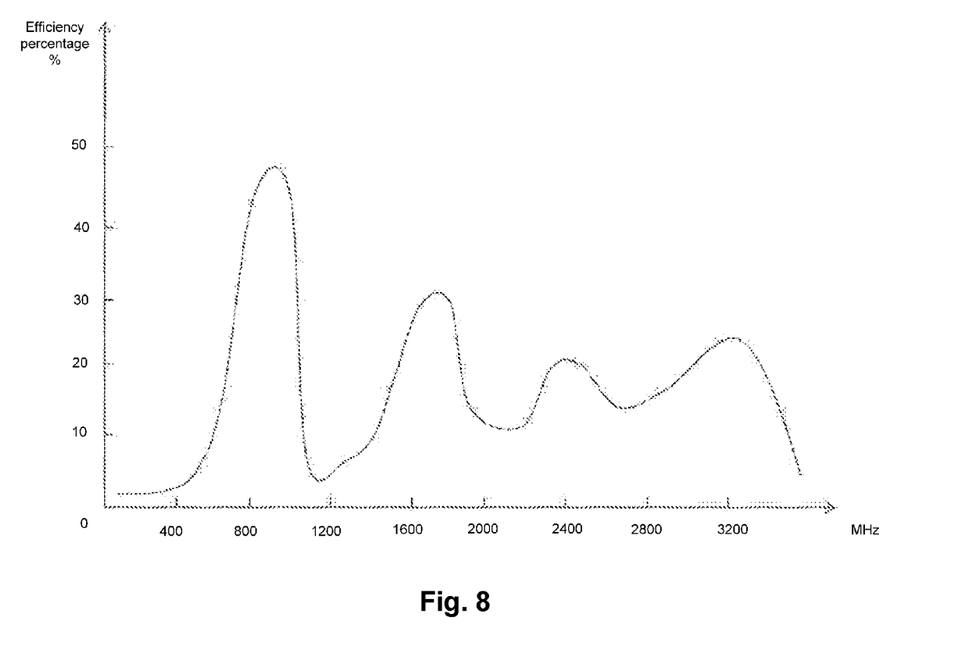
FIG. 8 is a diagram of first adjusted tuning parameter antenna efficiency according to an exemplary embodiment of the present disclosure.
Figure 9:
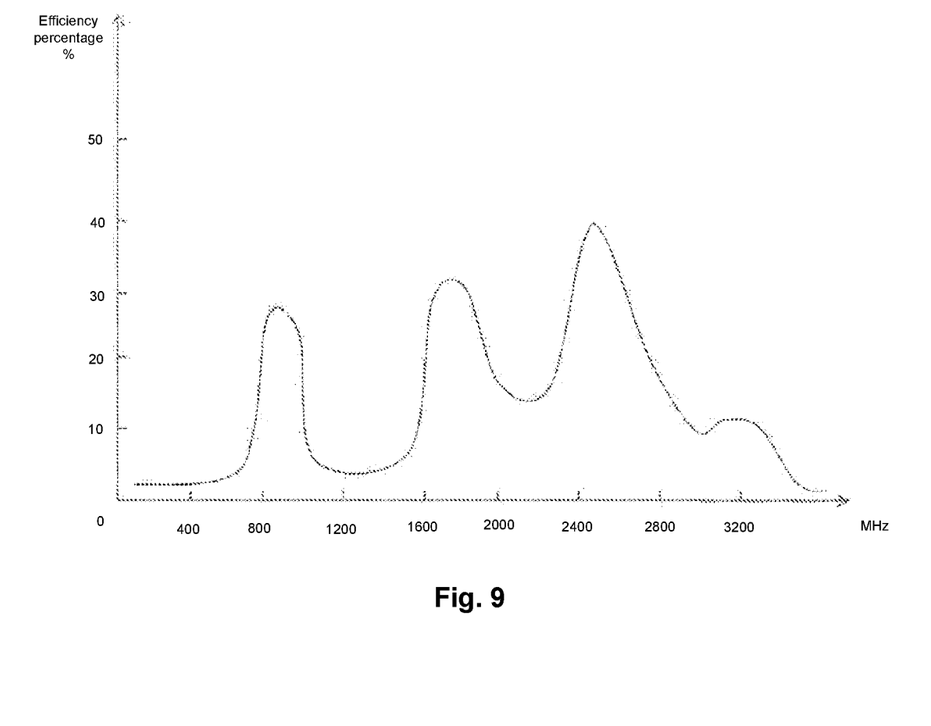
FIG. 9 is a diagram of second adjusted tuning parameter antenna efficiency according to an exemplary embodiment of the present disclosure.

As shown in FIG. 7, it is a default parameter antenna efficiency diagram. A user of the present disclosure can tune an antenna independently. For example, in remote areas where the signal is weak, users give priority to ensuring smooth voice calls and mobile 2G voice communications. By adjusting the tuning parameters, as shown in FIG. 8, it is a full-band antenna efficiency diagram after adjusting the capacitance value to 3.5 pF, a mobile 2G band is between 880 MHz and 1 GHz. The efficiency comparison of FIG. 8 and FIG. 7 shows that: the antenna efficiency of FIG. 8 in the mobile 2G band is increased by 15% compared to FIG. 7, which effectively improves the quality of mobile 2G voice calls. For example, in the periphery of a city, users give priority to mobile 4G networks. By adjusting the tuning parameters, as shown in FIG. 9, it is a full-band antenna efficiency diagram after adjusting the capacitance value to 0.6 pF, a mobile 4G band is between 2.57G and 2.65 GHz. The efficiency comparison of FIG. 9 and FIG. 7 shows that: the antenna efficiency of FIG. 9 in the mobile 4G band is increased by 10% compared to FIG. 7, which effectively improves the quality of mobile 4G network service.

According to the independent tuning system for the antenna, the tuning method, and the communication device provided by the present disclosure, a user can independently adjust antenna performance according to user demands by means of an antenna tuning program installed on the communication device, so that the communication device is in the best use state. When the user uses the communication device, the best use experience is obtained, the user obtains a sense of participation, gain, recognition, and pride in the research and development and design of the communication device, and the user's overall experience is enhanced.

The above are some specific implementations of the present disclosure, but the design concept of the present disclosure is not limited to the specific implementations mentioned above. Any insubstantial modification of the present disclosure using this concept should be an act that violates the protection scope of the present disclosure.

What is claimed is:

1. An independent tuning system for an antenna, applicable to a communication device, wherein the communication device comprises: an antenna tuner, a tuning driver and a tuning program, and the tuning program comprises:

a storage component, configured to store a graph or a curve chart of correspondence information between tuning parameters and antenna efficiency in the tuning program;

an input component, configured to receive a tuning parameter input by a user, wherein the tuning parameter input by the user comprises: a band range and a capacitance value;

a matching component, configured to match a tuning parameter corresponding to optimized antenna efficiency according to the tuning parameter input by the user and the graph or curve chart of the correspondence information between the tuning parameters and the antenna efficiency stored in the tuning program; and a tuning component, configured to tune a tuning parameter of the antenna tuner according to the matched tuning parameter and write an NV value of the tuning driver to achieve independent optimized tuning of the antenna.

2. The independent tuning system for an antenna as claimed in claim 1, wherein the tuning program further comprises:

a default parameter component, configured to default a factory-set antenna parameter of the communication device.

3. The independent tuning system for an antenna as claimed in claim 1, wherein the tuning program further comprises:

a search component, configured to search for a band according to information input by the user.

4. A communication device, comprising an independent tuning system for an antenna, wherein the communication device comprises: an antenna tuner, a tuning driver and a tuning program, and the tuning program comprises:

a storage component, configured to store a graph or a curve chart of correspondence information between tuning parameters and antenna efficiency in the tuning program;

an input component, configured to receive a tuning parameter input by a user;

a matching component, configured to match a tuning parameter corresponding to optimized antenna efficiency according to the tuning parameter input by the user and the graph or curve chart of the correspondence information between the tuning parameters and the antenna efficiency stored in the tuning program; and a tuning component, configured to tune a tuning parameter of the antenna tuner according to the matched tuning parameter and write an NV value of the tuning driver to achieve independent optimized tuning of the antenna;

wherein the communication device is one of the followings: a mobile phone, a tablet computer, and a walkie-talkie.

5. The communication device as claimed in claim 4, wherein the tuning program further comprises:

a default parameter component, configured to default a factory-set antenna parameter of the communication device.

6. The communication device as claimed in claim 4, wherein the tuning program further comprises:

a search component, configured to search for a band according to information input by the user.

7. A tuning method of an independent tuning system for an antenna, comprising:

storing a graph or a curve chart of correspondence information between tuning parameters and antenna efficiency in a tuning program;

receiving a tuning parameter input by a user, wherein the tuning parameter input by the user comprises: a band range and a capacitance value;

matching a tuning parameter corresponding to optimized antenna efficiency according to the tuning parameter input by the user and the graph or curve chart of the correspondence information between the tuning parameters and the antenna efficiency stored in the tuning program; and tuning a tuning parameter of the antenna tuner according to the matched tuning parameter and writing an NV value of the tuning driver to achieve independent optimized tuning of the antenna.

8. The tuning method of an independent tuning system for an antenna as claimed in claim 7, further comprising:

defaulting a factory-set antenna parameter of a communication device.

9. The tuning method of an independent tuning system for an antenna as claimed in claim 7, wherein the tuning parameter input by the user further refers to other information for indicating the search component to search for a corresponding band range.

10. The tuning method of an independent tuning system for an antenna as claimed in claim 9, wherein the other information comprises operator information, network standard information and band information, the operator information comprises China Mobile, China Unicom, and China Telecom, the network standard comprises 5G, 4G, 3G, and 2G, and the band information comprises high frequency, intermediate frequency, and low frequency.

11. The tuning method of an independent tuning system for an antenna as claimed in claim 7, wherein the matching component matches an optimal tuning parameter according to the graph or curve chart of the correspondence information between the tuning parameters and the optimized antenna efficiency.

12. The tuning method of an independent tuning system for an antenna as claimed in claim 11, wherein the tuning parameter input by the user refers to a capacitance value input by the user step by step, and after the capacitance value is input, the graph or curve chart of the correspondence information between the tuning parameters and the antenna efficiency is displayed with the change of the capacitance value for user selection.

\* \* \* \* \*